United States Patent
Partlo et al.

(10) Patent No.: US 6,795,474 B2
(45) Date of Patent: *Sep. 21, 2004

(54) GAS DISCHARGE LASER WITH IMPROVED BEAM PATH

(75) Inventors: William N. Partlo, Poway, CA (US); Richard L. Sandstrom, Encinitas, CA (US); Holzer K. Glatzel, San Diego, CA (US); Raymond F. Cybulski, San Diego, CA (US); Peter C. Newman, San Diego, CA (US); James K. Howey, Vista, CA (US); William G. Hulburd, San Diego, CA (US); John T. Melchior, San Diego, CA (US); Alex P. Ivaschenko, La Jolla, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/000,991

(22) Filed: Nov. 14, 2001

(65) Prior Publication Data

US 2002/0105994 A1 Aug. 8, 2002

Related U.S. Application Data

(63) Continuation-in-part of application No. 09/716,041, filed on Nov. 17, 2000, and a continuation-in-part of application No. 09/854,097, filed on May 11, 2001.

(51) Int. Cl.[7] .................................................. H01S 3/22
(52) U.S. Cl. ......................................... 372/57; 372/55
(58) Field of Search .................................... 372/57, 55

(56) References Cited

U.S. PATENT DOCUMENTS 3,593,189 A 7/1971 Buhrer ...................... 331/94.5
4,223,279 A 9/1980 Bradford, Jr. et al. ..... 331/94.5
4,455,658 A 6/1984 Sutter, Jr. ..................... 372/38
4,697,270 A 9/1987 Galkowski ................... 372/34
4,798,467 A 1/1989 Wyeth et al. ............... 356/349
4,817,101 A 3/1989 Wyeth et al. ................. 372/32
4,823,354 A 4/1989 Znotins et al. ................ 372/57
4,881,231 A 11/1989 Jain ............................ 372/32
4,883,352 A 11/1989 Bruning ..................... 353/122
4,940,331 A 7/1990 Wyeth et al. ............... 356/349

(List continued on next page.)

FOREIGN PATENT DOCUMENTS

JP           04314374 A     11/1992
JP          405167172 A      7/1993

OTHER PUBLICATIONS

Ishihara, T., et al., "Advanced Krypton Fluoride Excimer Laser for Microlithography," SPIE vol. 1674, Optical/Laser Microlithography V (1992), pp. 473–485.
"Introduction to Signal Condition for ICP® & Charge Piezoelectric Sensors", from website: www.pcb.com/tech_signal.htlm, ©copyright PCB Piezotronics 1999.

*Primary Examiner*—Paul Ip
*Assistant Examiner*—Leith Al-Nazer
(74) *Attorney, Agent, or Firm*—William Cray

(57) ABSTRACT

An excimer laser with a purged beam path capable of producing a high quality pulsed laser beam at pulse rates in excess of 2,000 Hz at pulse energies of about 5 mJ or greater. The entire purged beam path through the laser system is sealed to minimize contamination of the beam path. A preferred embodiment comprises a thermally decoupled LNP aperture element to minimize thermal distortions in the LNP. This preferred embodiment is an ArF excimer laser specifically designed as a light source for integrated circuit lithography. An improved wavemeter is provided with a special purge of a compartment exposed to the output laser beam.

26 Claims, 14 Drawing Sheets

U.S. PATENT DOCUMENTS

| | | | |
|---|---|---|---|
| 4,959,840 A | 9/1990 | Akins et al. | 372/57 |
| 5,023,884 A | 6/1991 | Akins et al. | 372/57 |
| 5,025,445 A | 6/1991 | Anderson et al. | 372/20 |
| 5,025,446 A | 6/1991 | Kuizenga | 372/21 |
| 5,083,093 A | 1/1992 | Adler et al. | 328/65 |
| 5,095,492 A | 3/1992 | Sandstrom | 372/102 |
| 5,128,601 A | 7/1992 | Orbach et al. | 372/30 |
| 5,189,678 A | 2/1993 | Ball et al. | 372/28 |
| 5,315,611 A | 5/1994 | Ball et al. | 372/56 |
| 5,371,587 A | 12/1994 | de Groot et al. | 356/349 |
| 5,373,515 A | 12/1994 | Wakabayashi et al. | 372/20 |
| 5,420,877 A | 5/1995 | Sandstrom | 372/34 |
| 5,440,578 A | 8/1995 | Sandstrom | 372/59 |
| 5,448,580 A | 9/1995 | Birx et al. | 372/38 |
| 5,450,207 A | 9/1995 | Fomenkov | 356/416 |
| 5,524,144 A | 6/1996 | Suzuki | 359/176 |
| 5,656,882 A | 8/1997 | Lazarus et al. | 310/328 |
| 5,691,989 A | 11/1997 | Rakuljic | 372/20 |
| 5,706,301 A | 1/1998 | Lagerström | 372/32 |
| 5,754,571 A | 5/1998 | Endoh et al. | 372/20 |
| 5,770,933 A | 6/1998 | Larson et al. | 318/254 |
| 5,771,258 A | 6/1998 | Morton et al. | 372/57 |
| 5,835,520 A | 11/1998 | Das et al. | 328/65 |
| 5,848,089 A | 12/1998 | Sarkar et al. | 372/58 |
| 5,852,621 A | 12/1998 | Sandstrom | 372/25 |
| 5,870,420 A | 2/1999 | Webb | 372/58 |
| 5,953,360 A | 9/1999 | Vitruk et al. | 372/87 |
| 5,978,394 A | 11/1999 | Newman et al. | 372/32 |
| 5,978,405 A | 11/1999 | Juhasz et al. | 372/57 |
| 5,991,324 A | 11/1999 | Knowles et al. | 372/57 |
| 6,005,879 A | 12/1999 | Sandstrom et al. | 372/25 |
| 6,018,537 A | 1/2000 | Hofmann et al. | 372/25 |
| 6,038,055 A | 3/2000 | Hansch et al. | 359/279 |
| 6,067,311 A | 5/2000 | Morton et al. | 372/57 |
| 6,078,599 A | 6/2000 | Everage et al. | 372/20 |
| 6,104,735 A | 8/2000 | Webb | 372/37 |
| 6,109,574 A | 8/2000 | Pan et al. | 248/176.1 |
| 6,128,323 A * | 10/2000 | Myers et al. | 372/38.1 |
| 6,164,116 A | 12/2000 | Rice et al. | 73/1.72 |
| 6,208,674 B1 | 3/2001 | Webb et al. | 372/57 |
| 6,208,675 B1 | 3/2001 | Webb | 372/58 |
| 6,219,368 B1 | 4/2001 | Govorkov | 372/59 |
| 6,240,110 B1 | 5/2001 | Ershov | 372/20 |
| 6,243,405 B1 | 6/2001 | Borneis et al. | 372/57 |
| 6,263,002 B1 | 7/2001 | Hsu et al. | 372/6 |
| 6,348,357 B2 | 2/2002 | Sano | 438/16 |
| 6,404,158 B1 | 6/2002 | Boisvert et al. | 318/469 |
| 6,477,193 B2 | 11/2002 | Oliver et al. | 372/58 |
| 6,493,364 B1 | 12/2002 | Baumier et al. | 372/15 |
| 6,529,533 B1 | 3/2003 | Voss | 372/29.01 |
| 2002/0167986 A1 * | 11/2002 | Pan et al. | 372/55 |

* cited by examiner

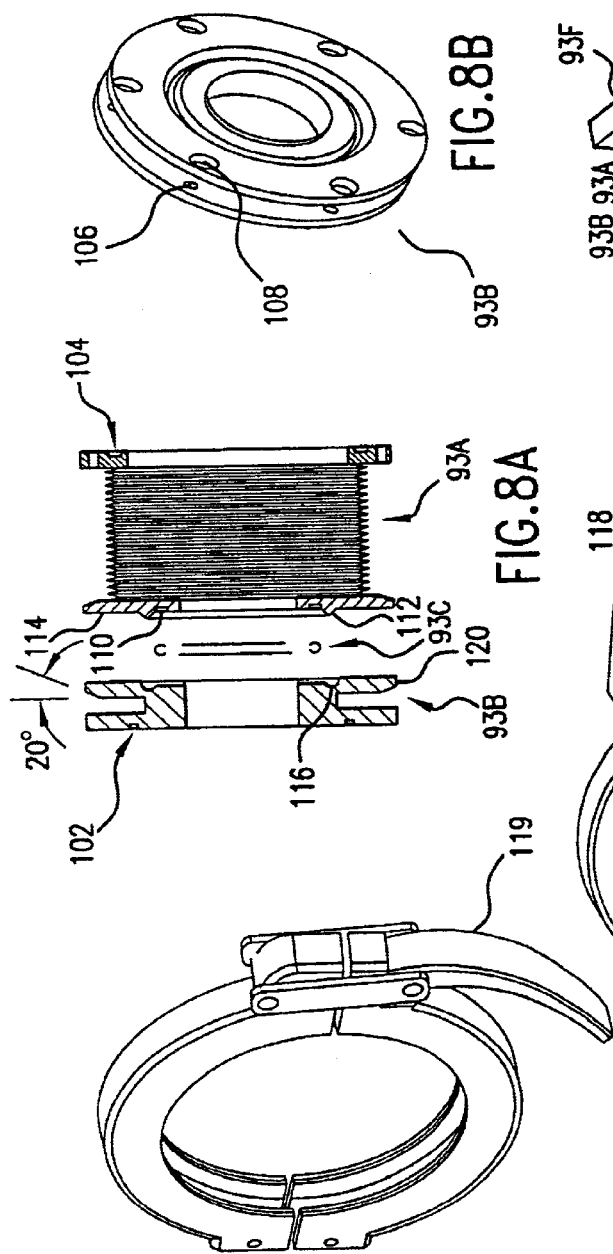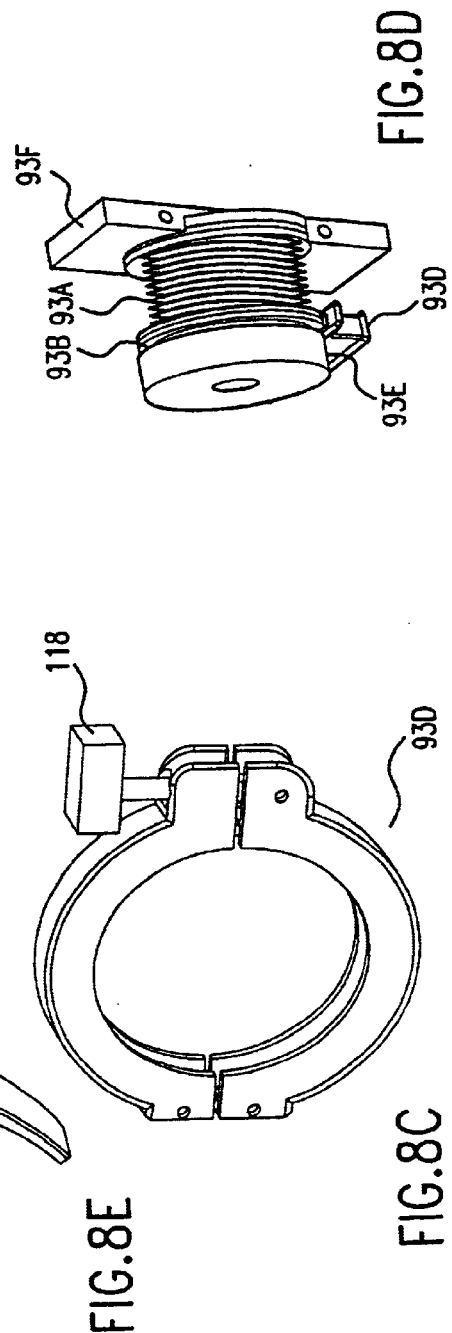

GAS DISCHARGE LASER WITH IMPROVED BEAM PATH

The application is a continuation-in-part of Ser. No. 09/716,041, filed Nov. 17, 2000 and Ser. No. 09/854,097, filed May 11, 2001 both of which are incorporated herein by reference. This invention relates to gas discharge lasers and in particular to high repetition rate gas discharge lasers producing high energy ultraviolet pulsed laser beams.

BACKGROUND OF THE INVENTION

Electric Discharge Gas Lasers

Electric discharge gas lasers are well known and have been available since soon after lasers were invented in the 1960s. High voltage discharges between two electrodes excite a gaseous gain medium. A resonance cavity containing the gain medium permits stimulated amplification of light which is then extracted from the cavity in the form of a laser beam. Many of these electric discharge gas lasers are operated in a pulse mode.

Excimer Lasers

Excimer lasers are a particular type of electric gas discharge laser and have been known as such since the mid 1970s. A description of an excimer laser, useful for integrated circuit lithography, is described in U.S. Pat. No. 5,023,884 issued Jun. 11, 1991 entitled "Compact Excimer Laser." This patent has been assigned to Applicants' employer, and the patent is hereby incorporated herein by reference. The excimer laser described in Patent '884 is a high repetition rate pulse laser. In FIG. 1 and FIG. 2, the principal elements of the laser 10 are shown. (FIG. 1 corresponds to FIG. 1 and FIG. 2 corresponds to FIG. 7 in Patent '884.) The discharges are between two long (about 23 inches) electrodes 18 and 20 spaced apart by about $5/8$ inch. Repetition rates of prior art lasers, like the one described, are typically within the range of about 100 to 2000 pulses per second. These high repetition rate lasers are usually provided with a gas circulation system. In the above referred to laser, this is done with a long squirrel-cage type fan 46, having about 23 blades 48. The fan blade structure is slightly longer than the electrodes 18 and 20 and provides sufficient circulation so that at pulse operating rates, the discharge disturbed gas between the electrodes is cleared between pulses. A finned water cooled heat exchanger 58 in FIG. 1 is used to remove heat from the laser gas which is added by the discharge and the fan.

Modular Design

These excimer lasers, when used for integrated circuit lithography, are typically operated on a fabrication line "around-the-clock"; therefore, down time can be expensive. For this reason most of the components are organized into modules which can be replaced normally within a few minutes.

Line Narrowing

Excimer lasers used for lithography must have its output beam reduced in bandwidth to a fraction of a picometer. This "line-narrowing" is typically accomplished in a line narrowing module (called a "line narrowing package" or "LNP") which forms the back of the laser's resonant cavity. This LNP typically is comprised of delicate optical elements including prisms, a mirror and a grating. As repetition rates increase maintaining stable performance by the LNP becomes a serious challenge.

Control of Beam Quality

When used as a light source for integrated circuit lithography, the laser beam parameters (i.e., pulse energy, wavelength and bandwidth) typically are controlled to within very tight specifications. This requires pulse-to-pulse feedback control of pulse energy and somewhat slower feedback control of wavelength of the line narrowed output beam. A doubling or more of the pulse rate requires these feedback control systems to perform much faster.

Increased Repetition Rates

A need exists for gas discharge laser light sources operating at higher average power than prior art devices in order to facilitate increases in production of integrated circuits. For example, there is a need for KrF, ArF and F2 lasers operating at repetition rates in the range of 4,000 Hz to 6,000 Hz and at pulse energies in the range of 5–10 mJ. Higher repetition rates at the above pulse energies create both thermal and radiation challenges inside the resonant cavity of these gas discharge lasers.

What is needed are improvements in the resonant cavity components of these gas discharge lasers to permit high quality performance at these substantially increased average power levels.

SUMMARY OF THE INVENTION

The present invention provides an excimer laser with a purged beam path capable of producing a high quality pulsed laser beam at pulse rates in excess of 2,000 Hz at pulse energies of about 5 mJ or greater. The entire purged beam path through the laser system is sealed to minimize contamination of the beam path.

A preferred embodiment comprises a thermally decoupled LNP aperture element to minimize thermal distortions in the LNP. This preferred embodiment is an ArF excimer laser specifically designed as a light source for integrated circuit lithography. An improved wavemeter is provided with a special purge of a compartment exposed to the output laser beam.

Typical prior art excimer lasers of this general type currently in operation are limited to pulse rates of about 1,000 Hz to 2,500 Hz. The present invention provides substantial improvement in laser beam quality and substantial increases in component lifetime as measured by number of laser pulses or total light output. These improvements in beam quality and component lifetime are achieved primarily by assuring an ultra-clean and pure laser beam path and by design improvements to minimize thermal transients while also minimizing the transfer chamber vibrations to the optical components.

This laser is constructed in modular form for quick easy modular replacement for maintenance and repair.

BRIEF DESCRIPTION OF THE DRAWINGS

FIGS. 8A, 8B, 8C, 8D and 8E show views of an easy seal bellows unit.

DETAILED DESCRIPTION OF PREFERRED EMBODIMENTS

Preferred embodiments of the present invention can be described by reference to the drawings.

First Preferred Embodiment

4 KHz ArF Lithography Laser

Figure 1:
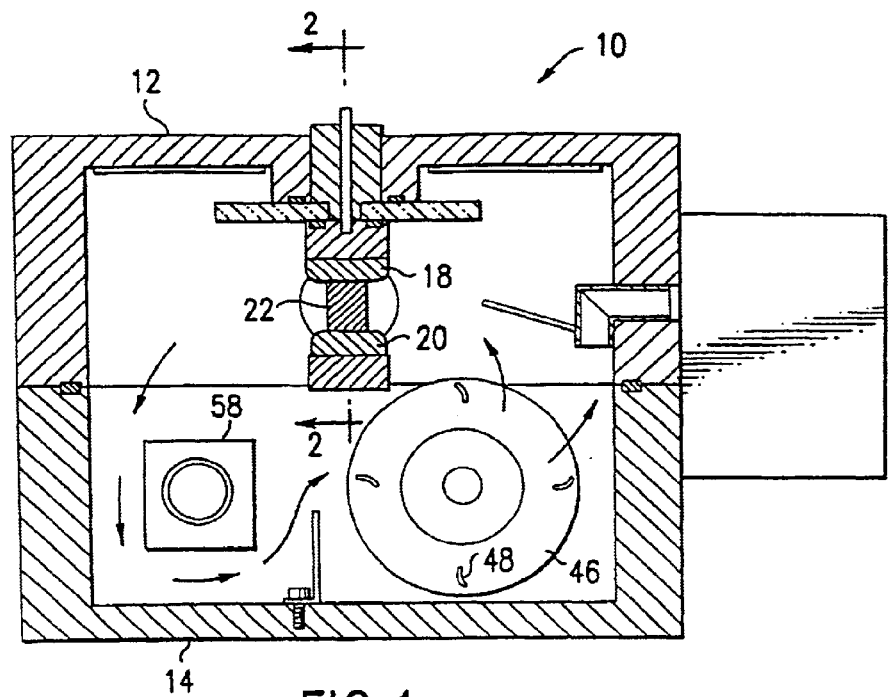
FIGS. 1 and 2 show features of a prior art laser system.
Figure 2:
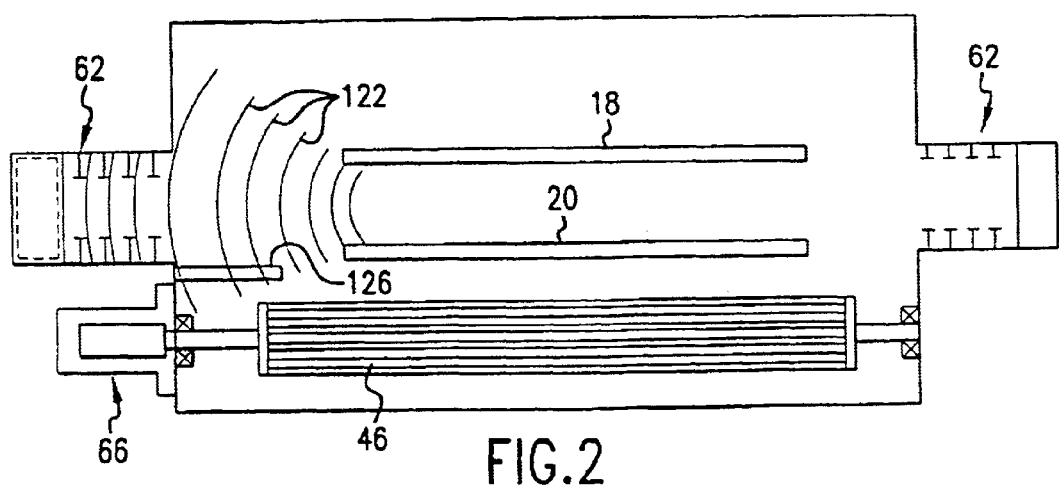
Figure 3:
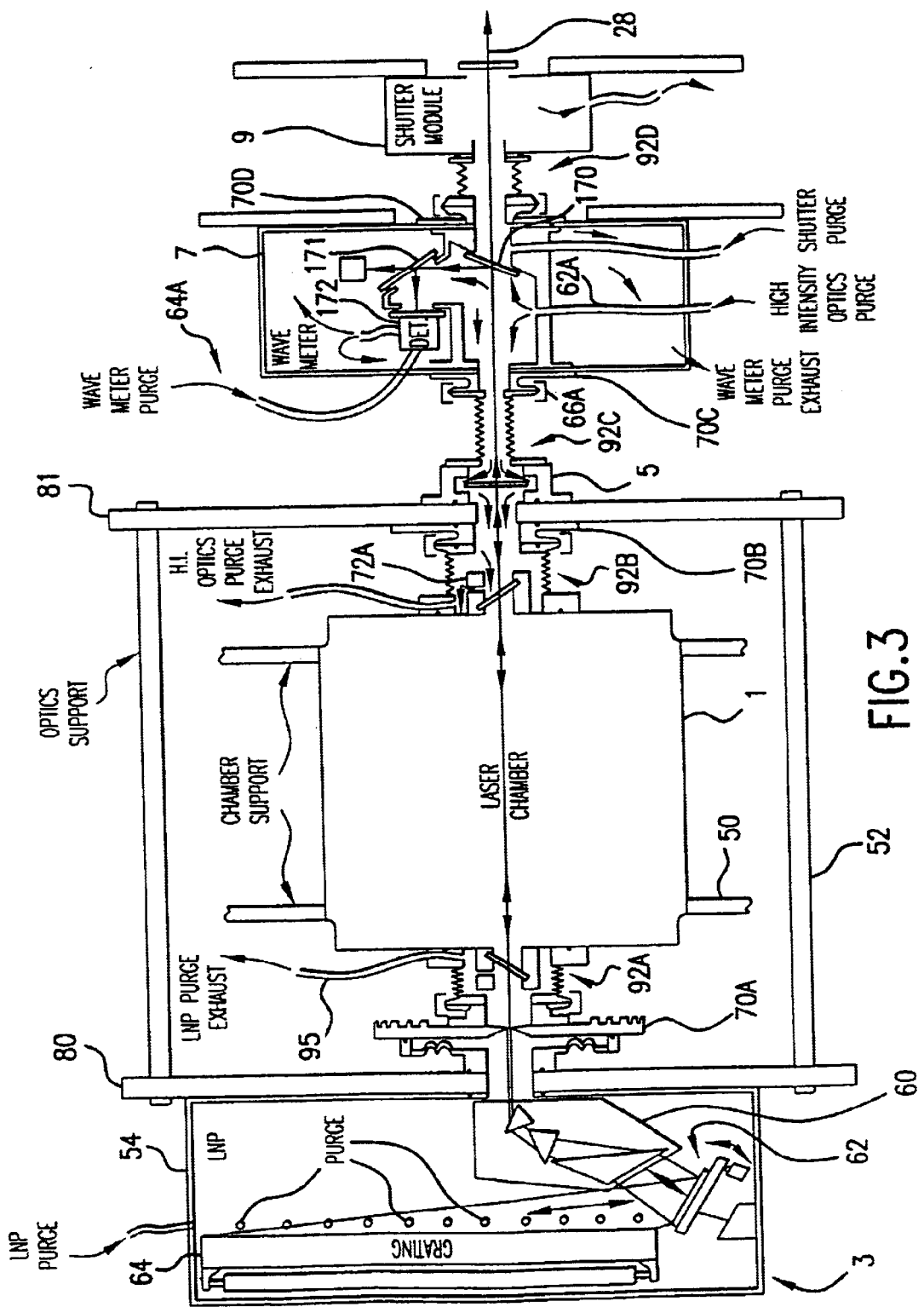
FIG. 3 is a sketch showing features of the preferred embodiment of the present invention.

A first preferred embodiment of the present invention is shown in FIG. 3. This is a schematic drawing of the laser chamber and optical components of a high repetition rate ArF excimer laser useful for integrated circuit lithography. This laser system is designed to operate at a repetition rate 4000 pulses per second producing narrow band pulses of 5 mJ. (The basic components of this system are the same for a companion KrF excimer laser designed to operate at 4,000 Hz with pulse energies of 10 mJ. The laser pulses of the ArF laser are at a wavelength of about 193 nm and the wavelength of the KrF laser pulses are about 248 nm). Principle modules of the laser system shown in FIG. 3 are the line narrowing package LNP module 3, the laser chamber module 1, the output coupler module 5, the wavemeter module 7 and the shutter module 9.

The LNP module 3 is mounted along with output coupler 5 on a low thermal expansion material (such as Invar®) three bar mount 52 (only two of the bars are shown in the figure) which is supported independent of the chamber module and isolates the LNP and the output coupler from chamber caused vibrations resulting primarily from laser discharges and fan rotation. The LNP includes a metal case 54 which contains a three prism beam expander 60, a tuning mirror 62 and a grating unit 64. Elements of the LNP are also shown in FIGS. 4A and 4B.

Figure 4:
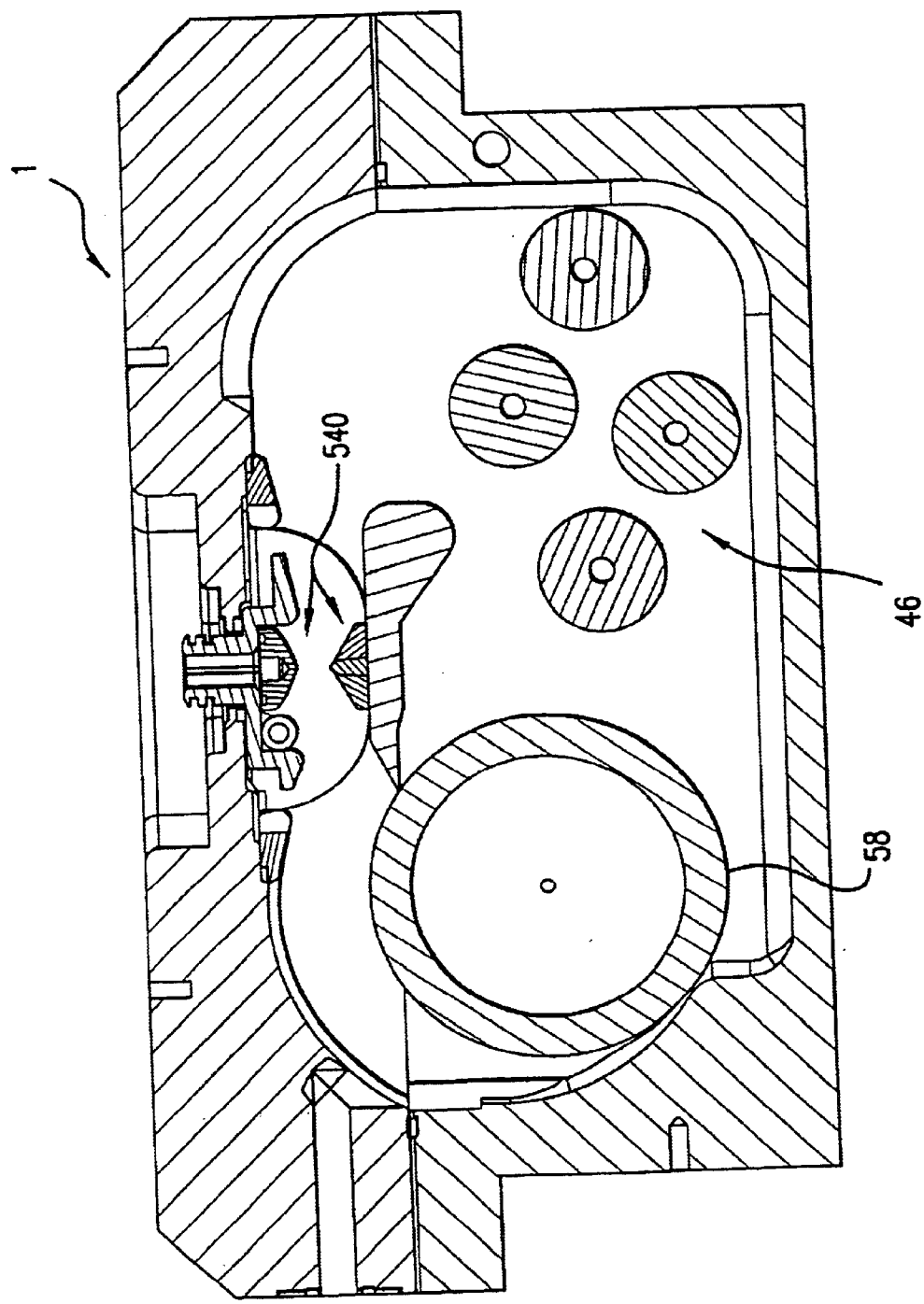
FIG. 4 shows a cross section of a laser chamber of the preferred embodiment.
Figure 4A:
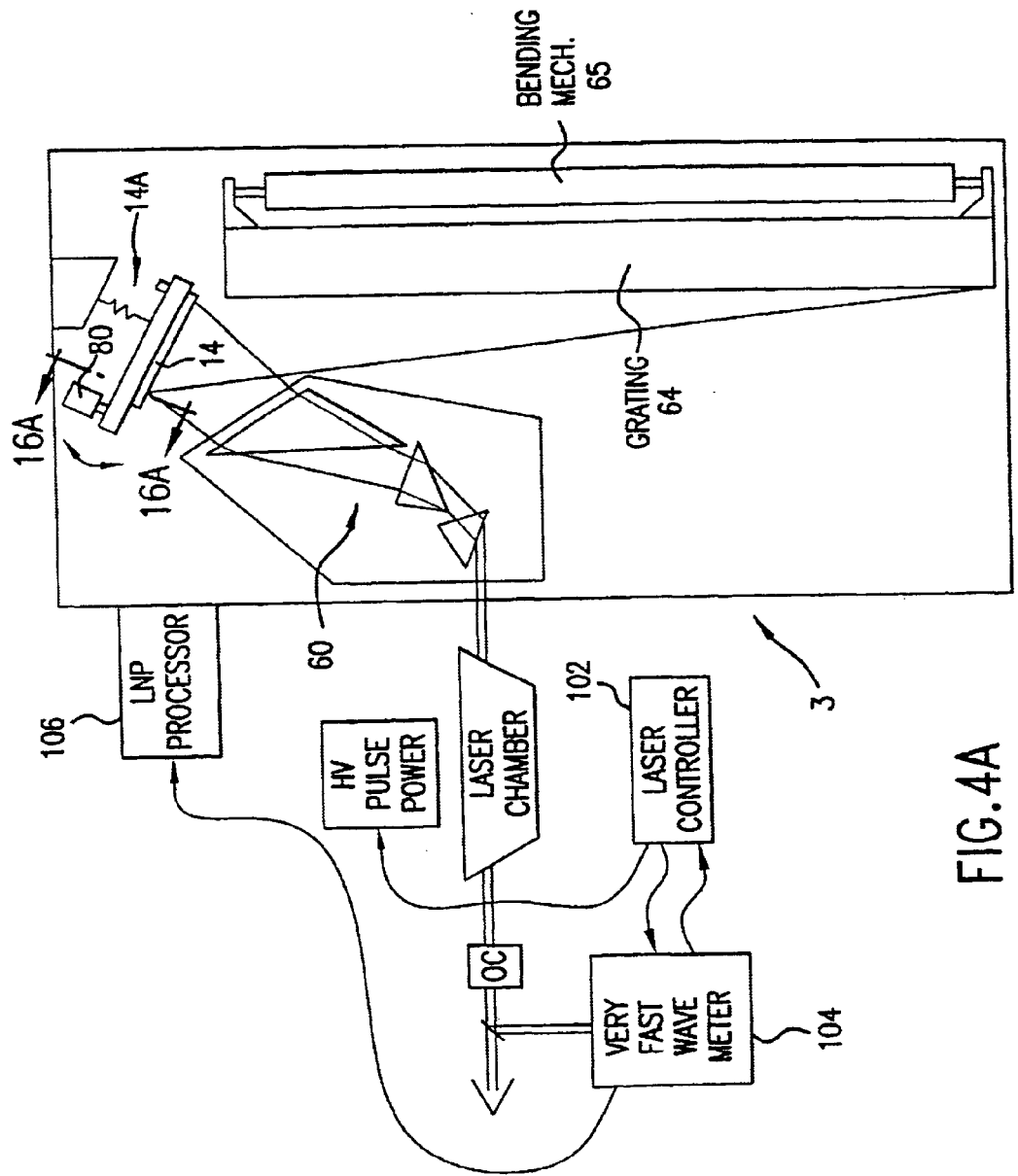
FIG. 4A is a drawing of a laser system demonstrating line narrowing.
Figure 4B:
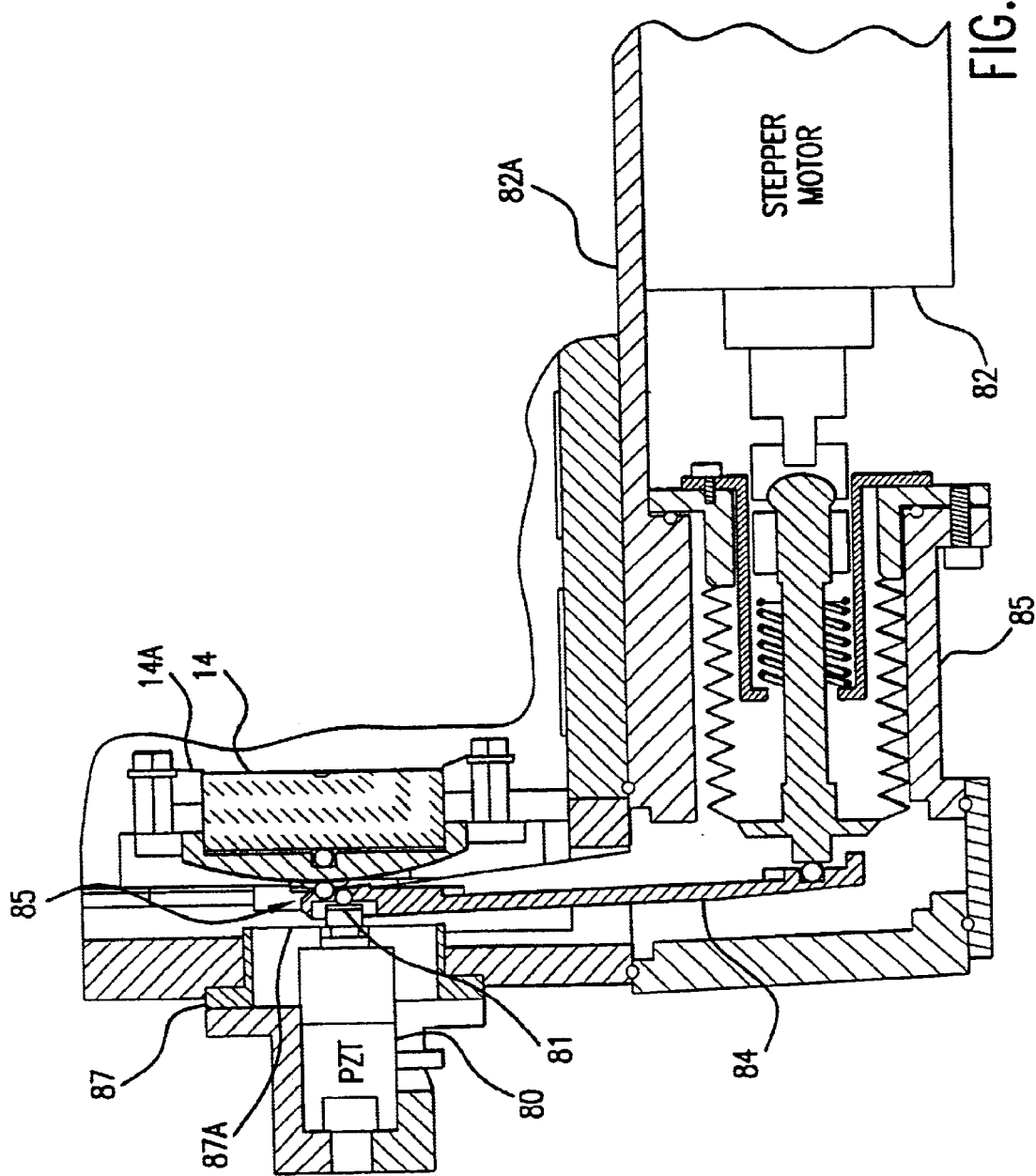
FIG. 4B is a drawing of showing tuning mirror controls.

Shown in FIG. 3 is laser chamber module 1 which is shown in cross section in FIG. 4. This chamber designed for 4,000 Hz operation as described above comprises four water cooled finned heat exchanger elements 46 and a five inch diameter tangential fan 58 and two 50 cm long electrodes 540 all of which are similar in design to prior art chamber components but in this case are designed for the higher 4,000 Hz repetition rate. A pulse power system (not shown) provides high voltage electrical pulses to produce discharges between electrodes 540 in the laser gas (in this ArF laser: 3.5 percent argon, 0.1 percent fluorine and the rest neon). The laser chamber is supported on rails 50 which are mounted within a laser frame (not shown) independent of the optical components of the laser system.

The output coupler module 5 is comprised of a metal container enclosing a partially reflecting mirror comprised of $CaF_2$ and which is coated to reflect 20 percent of light at the nominal ArF laser wavelength of 193 nm. This module is mounted on support 81 of 3-bar mount 52 and it along with the grating in the LNP defines the boundary of the resonant cavity for this laser system.

Figure 5:
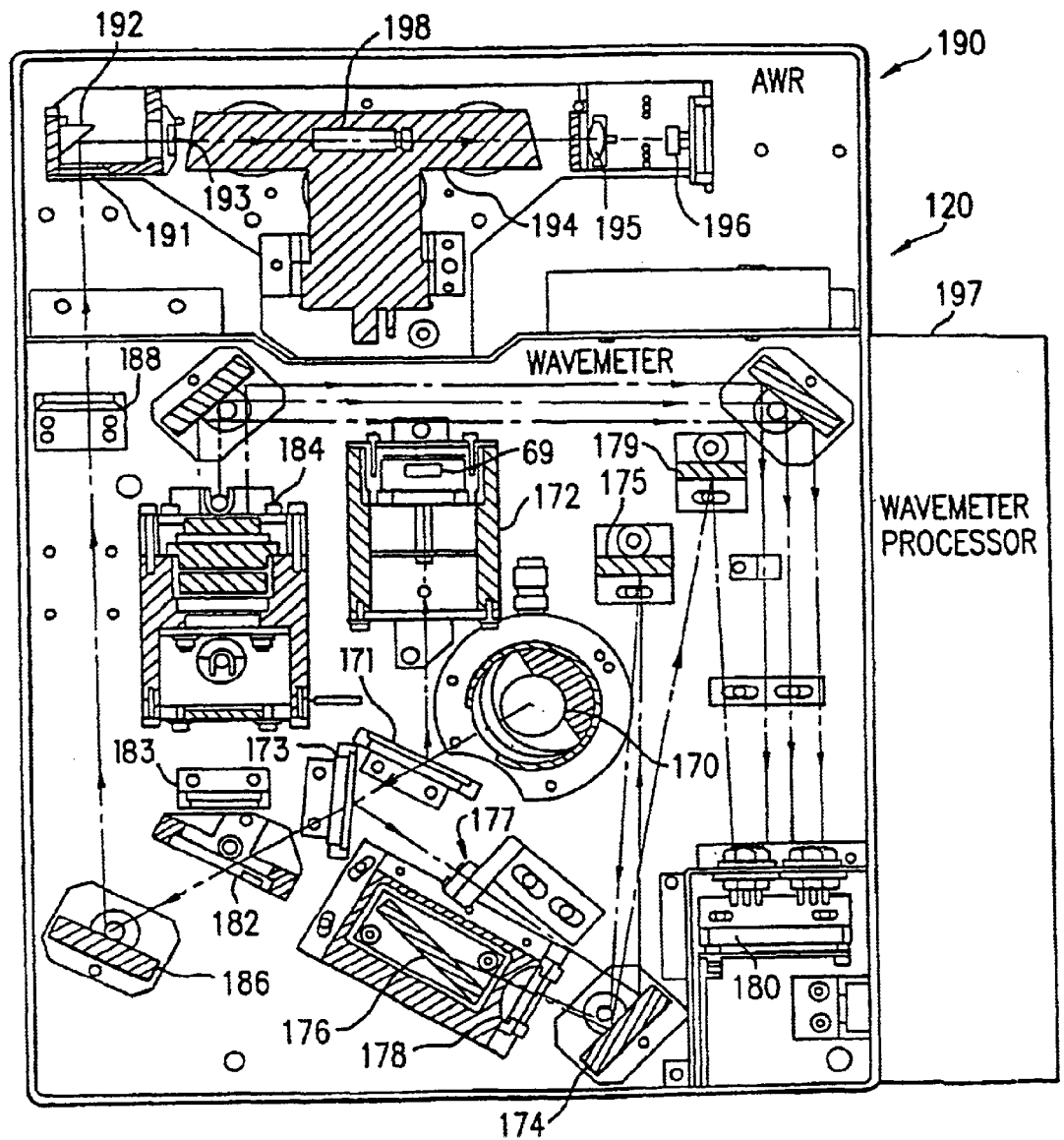
FIG. 5 shows components of a wavemeter of the preferred embodiment.
Figure 5A:
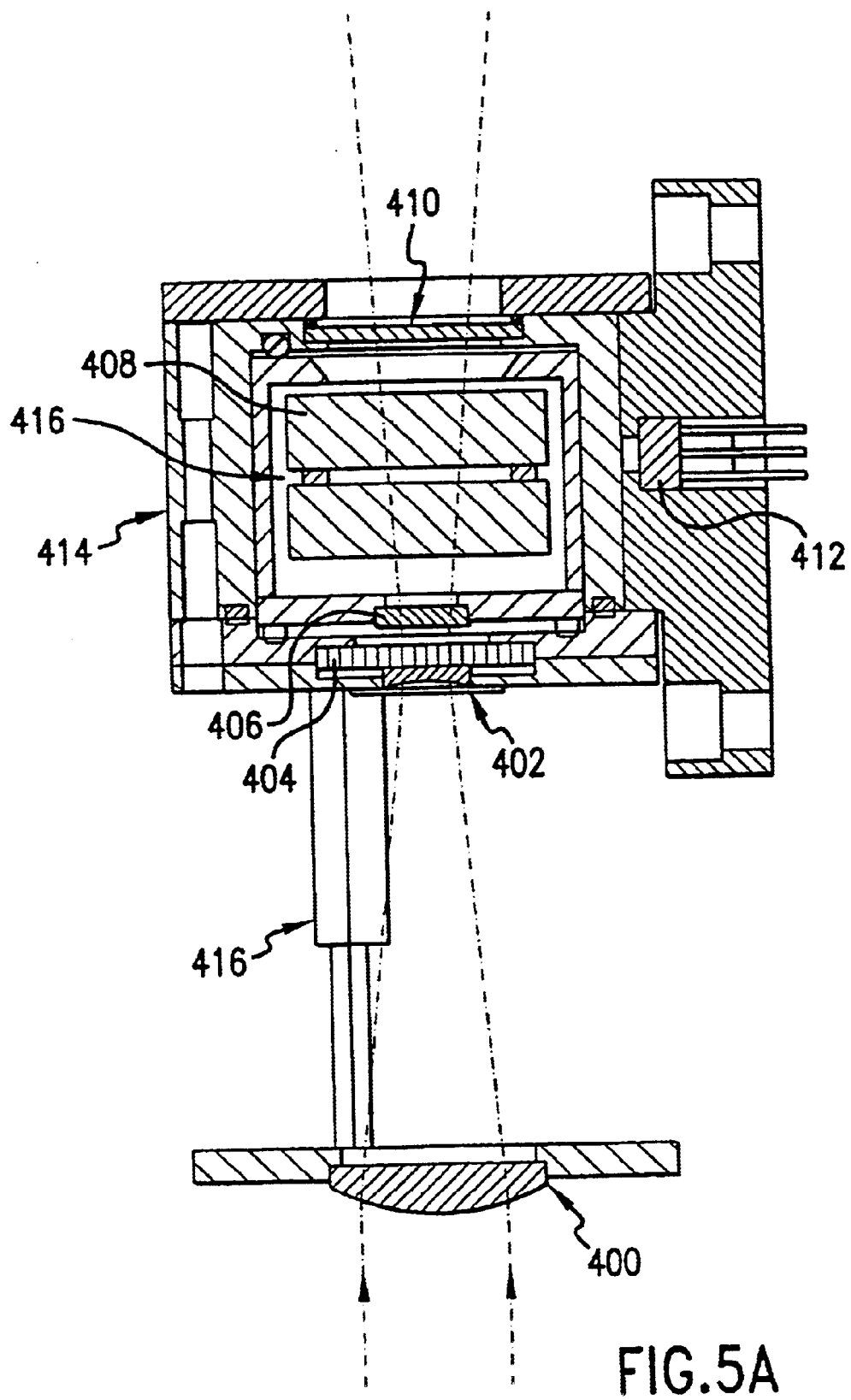
FIG. 5A shows an etalon configuration in the above wavemeter.

Immediately downstream of output coupler module 5 is wavemeter module 7 as shown in FIG. 3. In this drawing, some of the components are shown with orientations different from actual in order to show in two-dimension an important purging technique of the high energy intensity portion of the wavemeter. In the actual preferred embodiment, most of the wavemeter components are arranged in a pattern geometrically perpendicular and the beam path. The main laser output beam passes straight through the wavemeter and a small portion of the beam is picked off partially reflecting mirror 170 for analysis. This analyzed portion of the beam within the wavemeter generally defines a plane perpendicular to the axis of the main laser beam 28. FIG. 5 shows the components of the wavemeter in their actual orientation.

The shutter for the laser system is contained in shutter module 9 is shown in FIG. 3.

Need for Control of Beam Path Environment

A well established practice in the ultraviolet laser industry is to purge the beam path with nitrogen. This purge has two major beneficial effects. It reduces the oxygen level in the beam path to a very low level. (Typically a few hundred parts per million.) It also keeps the level of contamination in the beam path resulting from outgassing to a very low level. However, even very low levels of oxygen and outgassed contamination are sufficient to produce significant adverse effects, especially as user beam quality specifications became tighter. The problem is significant for KrF lasers at 248 nm but becomes severe for ArF lasers at 193 nm and $F_2$ lasers at 153 nm. Applicants have determined that the useful life of optical components in the beam path for a given laser is roughly inversely proportional to the oxygen level, roughly inversely proportional to the level of contamination and roughly inversely proportional to the integrated ultraviolet flux. Since the integrated flux rate is increasing, substantial reduction in oxygen levels and contamination levels are needed in order to maintain component life or to increase component life. Also, reduction in the levels of oxygen and contaminants are expected to improve beam quality.

Line Narrowing Module

FIG. 4A is a block diagram showing the interrelation of features of the preferred laser system which are important for controlling the wavelength and pulse energy of the output laser beam. Shown are the line narrowing module 3 which contains a three prism beam expander, a tuning mirror 14 and a grating 64. Wavemeter 104 monitors the output beam wavelength and provides a feedback signal to LNP processor 106 which controls the position of tuning mirror 14 by operation of a stepper motor and PZT stack 80A to keep the wavelength of the output beam within a desired very narrow range. Operational wavelengths can be selected by laser controller 102. Pulse energy is also measured in wavemeter 104 which provides a signal used by controller 102 to control pulse energy by regulating the discharge voltage in a feedback arrangement as described above. FIG. 4B is a block diagram showing PZT stack 80A, stepper motor 82 and mirror 14.

Large changes in the position of mirror 14 are produced by stepper motor 82 through a 26.5 to 1 lever arm 84. In this case a diamond pad 80B at the end of piezoelectric drive 80A is provided to contact spherical tooling ball at the fulcrum of lever arm 84. The contact between the top of lever arm 84 and mirror mount 86 is provided with a cylindrical dowel pin on the lever arm and four spherical ball bearings mounted (only two of which are shown) on the mirror mount as shown at 85A. Piezoelectric drive 80A is mounted on the LNP frame with piezoelectric mount 80A and the stepper motor is mounted to the frame with stepper motor mount 82A. Mirror 14 is mounted in mirror mount 86 with a three point mount using three aluminum spheres, only one of which are shown in FIG. 4B. Three springs 14A (only one is shown in FIG. 4A) apply the compressive force to hold the mirror against the spheres. This embodiment includes a diaphragm unit 87 with drum face 87A as shown in FIG. 4B to isolate the piezoelectric drive from the environment inside the LNP. This embodiment also includes a bellows unit 85 shown in FIG. 4B to isolate the stepper motor from the environment inside the LNP.

All leakage paths in the LNP have been sealed. These include a metal c seal sealing the metal top cover of the LNP to the LNP enclosure body. Seal covers with metal C-seals have beam provided for all other openings including an opening for adjustment screw for adjustment of bending mechanism 65 as shown in FIG. 4A.

LNP Aperture Heating

One of the optical elements of the LNP is the aperture which defines the beam cross section dimension especially the beam width entering and exiting the LNP. Typically the aperture is rectangular with dimensions such as 3 mm in the horizontal and 18 mm in the vertical. The beam expands in both the chamber and the LNP so a significant fraction of the beam is incident on the material that defines the aperture. This fraction is either absorbed in the material or is reflected from it. As the repetition rate of the laser increases heating of the material defining the aperture can become substantial. In some cases in prior art lasers of this type, the heating of the aperture is sufficient to cause distortion of the LNP enclosure which in turn causes misalignment of the optical components in the LNP which adversely affects beam quality.

The preferred embodiment of the present invention shown in FIG. 3 includes a new LNP aperture which is thermally decoupled from the LNP. This minimizes thermal transients in the LNP which would otherwise result from cyclical heating of the aperture material as the result of changes in laser output.

Thermally Decoupled Aperture

Figure 6C:
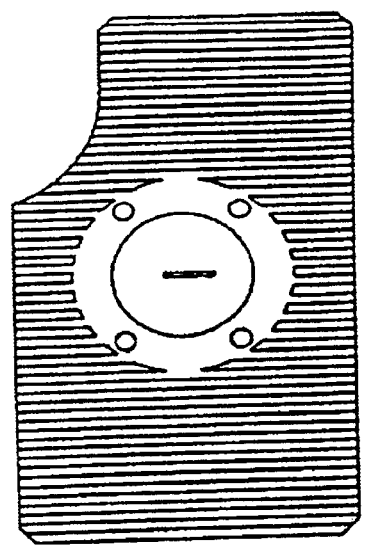
FIGS. 6A, 6B and 6C show views of a thermally decoupled aperture.
Figure 6B:
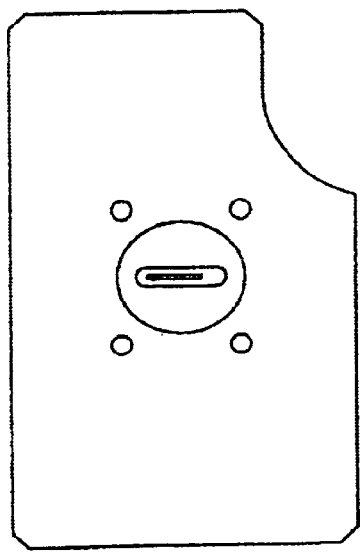
Figure 6A:
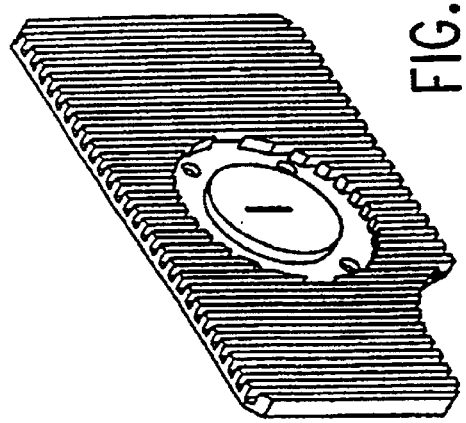
Figure 7:
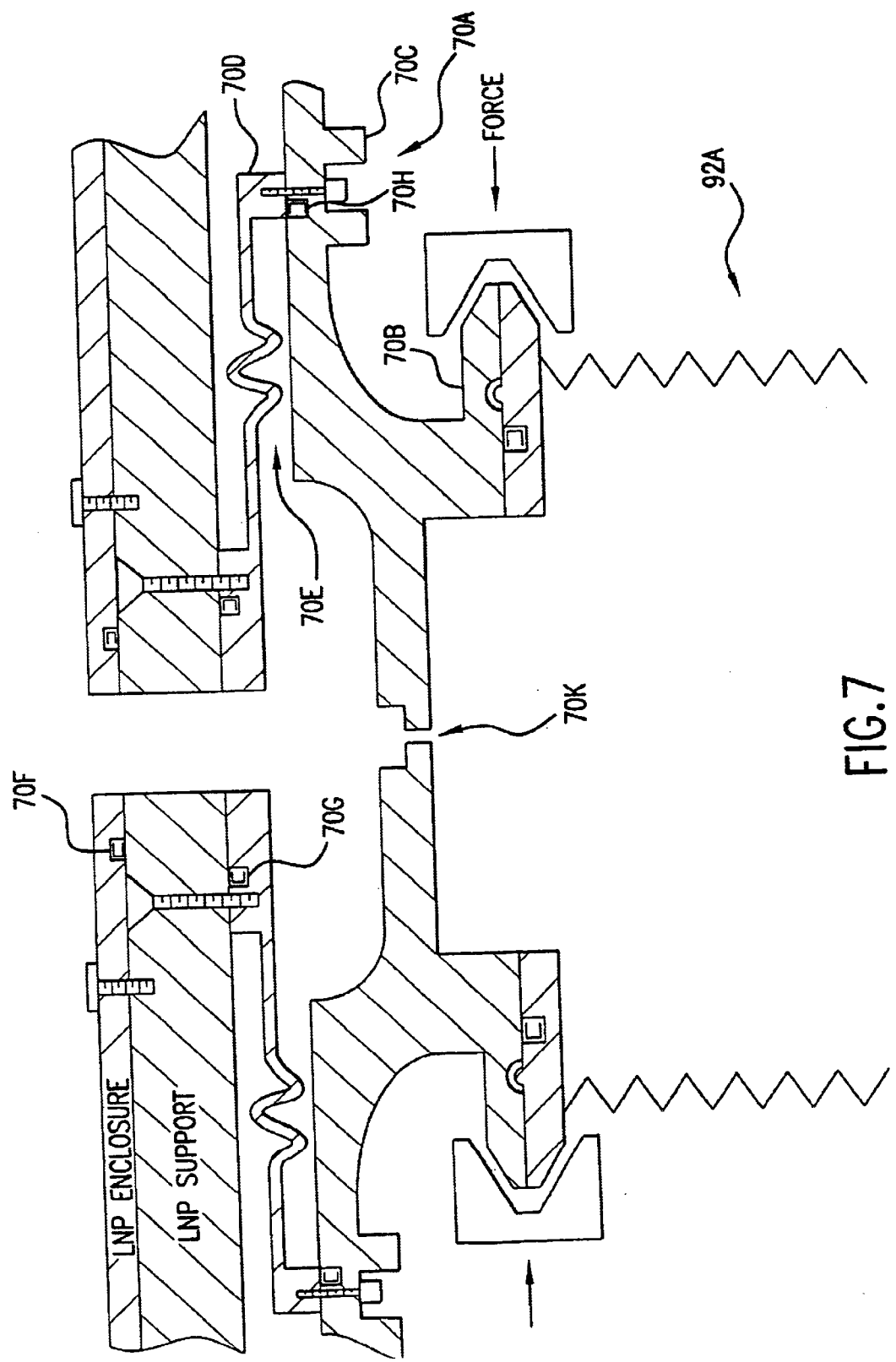
FIG. 7 shows a portion of a thermally decoupled aperture.

A thermally decoupled aperture including a heat sink-heat dissipator section is shown FIGS. 6A, B and C. FIGS. 6A, B and C do not show the two seal brackets 70B and 70D which are shown in FIG. 7 and FIG. 3. The aperture passage itself 70K (as shown in FIG. 7) is 1.7 mm wide and 20.95 mm tall. Applicants estimate that the walls of the aperture block roughly about half of the pulse energy coming from the chamber to the LNP and about 20% of the pulse energy returning from the LNP. Roughly about 15% to 40% of the blocked beams are absorbed and the rest are reflected in both directions. The walls of the aperture are angled at 2 degrees so that the reflected light is not amplified. The energy absorbed by the walls of the aperture for the preferred embodiment is roughly about 10 mJ per pulse. The laser at continuous operation produces 4000 pulses per second so that the energy absorbed by the walls of the aperture is about 40 J/second (i.e., 4 Watt). In one embodiment, the aperture element is aluminum with a mass of about 800 gm and a surface area of 0.2 $m^2$. Aluminum has a heat capacity of about 0.9 J/gm°K so the heat capacity of the aperture element is about 720 J/°C. Therefore, neglecting heat loss, at continuous operation the temperature of the aperture element will increase at a rate of about 0.055° C./second about 3.3° C./minute. Assuming an α diffusion value of 10 W/$m^{2\circ}$K with the surface area of 0.2 $m^2$ the equilibrium temperature rise of the aperture will be about ΔT=(40 W)/(10 W/$m^{2\circ}$ C.)(0.2 $m^2$) or about 20° C.

Normally, the laser is operated in a burst mode such as a bursts of 4000 pulses per second for 0.3 second with a 0.3 second down time repeated for 100 pulses after which there is a 1 minute down time to switch wafers followed by another 100 burst of pulses, etc. This sequence could continue for periods of days, around the clock. With this mode of operation, the average temperature of the aperture element will fluctuate by about 10° C. This is an important improvement over the prior art in which the walls of the aperture directly coupled to the LNP enclosure suffered temperature fluctuations of up to about 50° C. and thus produced distortions of the LNP structure and the optical components in it which adversely affected beam quality.

Easy Sealing Bellows Seal

Applicants have developed an easy sealing bellows seals to permit quick sealing of the beam path to a vacuum compatible seal when reinstalling laser modules (including the chamber 1, the output coupler 5, the wavemeter 7 and the shutter 9) in the beam path. The reader should note that although the seals provide vacuum quality seals of the respective sealed portions of the beam path, the path is not operated as a vacuum but typically at pressures slightly in excess of atmospheric.

Fast sealing is important since there is a great need that these modules be replaceable within a few minutes. The easy sealing bellow seals are shown at 92A, 92B, 92C and 92D in FIG. 3. The basic design of the easy sealing bellows seal is shown in FIGS. 8A–E. The easy sealing bellows seals are a four part seal. These four parts are (I) bellows part 93A shown in FIG. 8A, flange part 93B shown in FIGS. 8A and 8B metal c seal ring 93C shown in FIG. 8A and a first compression ring clamp 93D shown in FIG. 8C. A second compression ring clamp is shown in FIG. 8E. An easy seal bellows is shown assembled in FIG. 8D. Two additional metal C-seals may be used to seal flange part 93B to a first laser part 93E and to seal bellows portion 93A to a second laser part 93F. These additional seals are placed in slots 102 and 104. Flange part 93B is sealed against the first laser part with screws through counter sunk holes 106 and which are tightened with an allen wrench through holes 108.

Flange part 93B comprises tapered flange 120. This flange has a 20° taper as shown in FIG. 8A. Flange 114 also has a 20° taper. Compression clamp 93D is then opened up by unscrewing finger bolt 118 and placed around tapered flanges 120 and 114. Compression clamp 93D has hinge section 122 and a bolt section 124. It has a tapered slotted inner circumference matching the type of flanges 114 and 120. The diameter of the slot with bolt 118 fully inserted is slightly smaller than the matching slanted surfaces of flanges 114 and 120 so that as bolt 118 is tightened the two flanges are forced together compressing c seal 93C between them to produce a vacuum compatible seal. Applicants have determined that 400 pounds of compression is preferred to assure the desired vacuum seal. This requires a torque of about 40 inch-pounds applied to the handle of bolt 118 of the first compression ring clamp. In this preferred embodiment, the handle is only 1-inch long so a speed wrench (or similar tool) would be needed by most technicians to provide the 40 inch pounds. If a two inch handle is provided the seal could be made with finger force. The second compression ring clamp shown in FIG. 8E forces the two tapered flanges together when curved lever arm 119 is pushed into position against the circumference of the ring. The clamp is opened by rotating the arm out from the ring circumference and then the two halves of the ring clamp can be separated. Applicants have estimated that a 40 pound force applied to the end of lever arm 119 results in a compressive force of about 400 pounds on C-seal 93C. This clamp design is based on the design of commercially available clamps known as "pull action toggle clamps".

Important advantages of this seal system are:

(1) The time to make the seal is insignificant (about 1 to 2 minutes);

(2) An excellent vacuum seal is produced;

(3) Substantial vibrational coupling between the chamber and optical components is avoided; and (4) The seal is inexpensive compared to most other vacuum sealing techniques.

The seal is made between flange part 93B and 93A with metal c seal 93C sandwiched in between the two parts as indicated in FIG. 8A using compression ring clamp 93D as shown in FIG. 8D. The metal seal fits into slot 110. The seal in these embodiments are made slightly oval to fit in the circular slot 110. The longer diameter of the c seal ring is 1.946 inches and the shorter diameter is 1.84 inches. Spring force in the oval shaped c seal ring produces forces against the edge of slot 110 which presents the c seal ring from falling out during assembly. Bellows part 93A comprises circular ridge 112 which protects seal ring 93C from being scratched by part 93B while the two parts are slid against each other during assembly. Thus, which replacement chamber 1 is rolled into place on rails 50, the flange portion 114 of bellows unit 93A slides against part 93B but circular ridge 112 protects metal c ring 93C from being scratched. When the chamber is in place, the ridge fits into slot 116.

LNP to Chamber Seal

In order to seal the beam path between chamber 1 and LNP 3, the standard easy seal bellows seal unit shown in FIGS. 8A, B, C, and D is modified slightly. The tapered flange portion of part 93B is made an integral part of the thermally decoupled aperture element 70A as shown at 70B in FIG. 7. Aperture element 70A comprises passive heat sinks portion 70C which has a shape similar to that shown in FIGS. 6A, B and C. Aperture element 70A also comprises cylindrical flexed sealing unit 70D. This unit permits thermal expansion of the aperture element without applying significant stress to the LNP support. The LNP is sealed to support unit 80 with metal C-seals at 70F. Sealing unit 70D is sealed with metal C-seals at 70G and 70H. Aperture element 70A is sealed to easy sealing bellows unit 92a as described in the previous section.

Other Easy Seal Bellows Seals

As shown in FIG. 3 in this preferred embodiment, the easy seal bellows seal design described above is used to make three other seals as shown at 92B, 92C and 92D. Bellows seal unit 92B is sealed to chamber 1 using metal C-seals. Bracket 71 is sealed to output coupler support 81 with metal C-seals and a compression ring 104 as described above is used to clamp the two parts together as shown at 92C and as described above.

Output coupler 5 is attached to output coupler support 81 and sealed with a metal c seal as shown in FIG. 3, and easy seal bellows seal is used to seal the output coupler to wavemeter tuning bracket 73. Similarly, the easy seal bellows seal 92D is used to sealingly connect the enclosure of wavemeter module 7 to the enclosure of shutter module 9.

High Duty Cycle LNP With $N_2$ Purge

Figure 9:
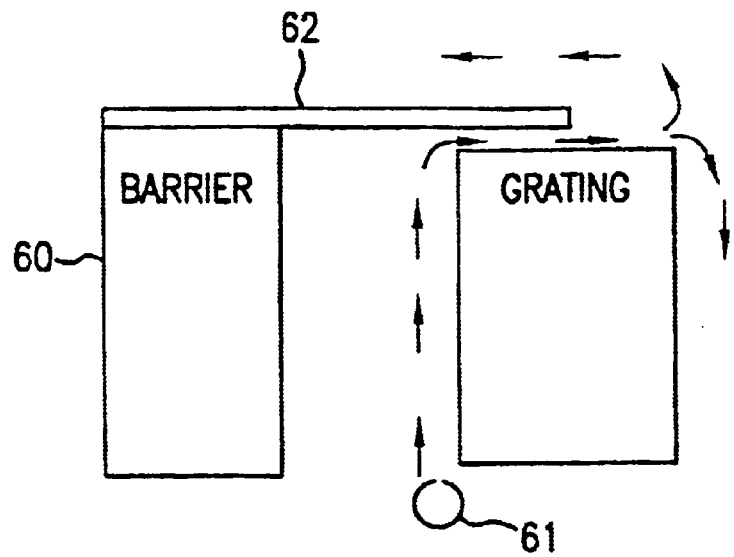
FIGS. 9, 9A, 9B and 9C show techniques for purging a grating face.
Figure 9A:
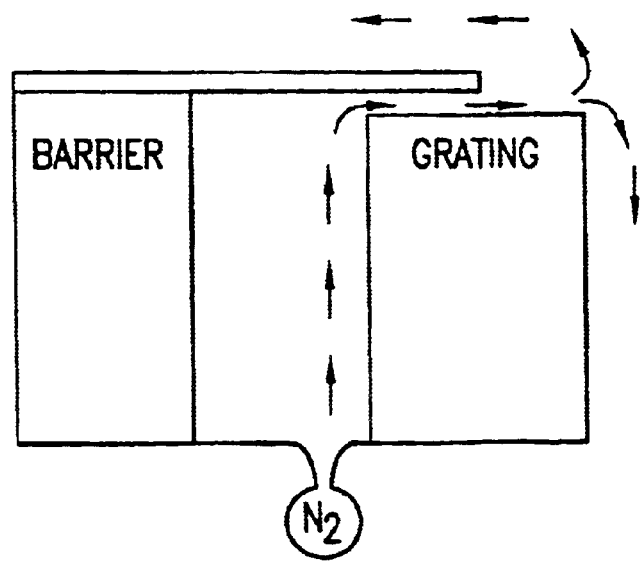
Figure 9B:
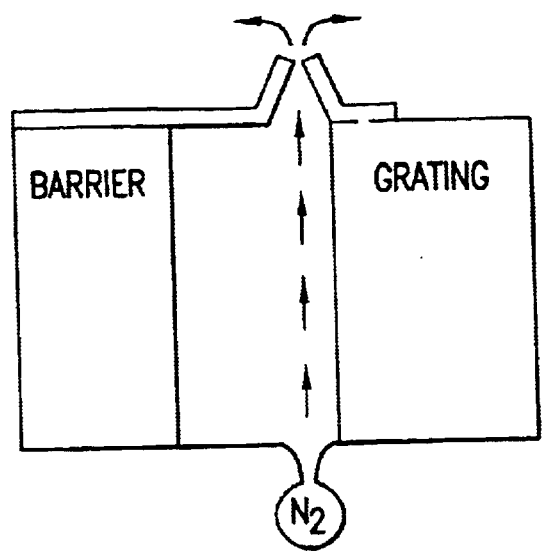
Figure 9C:
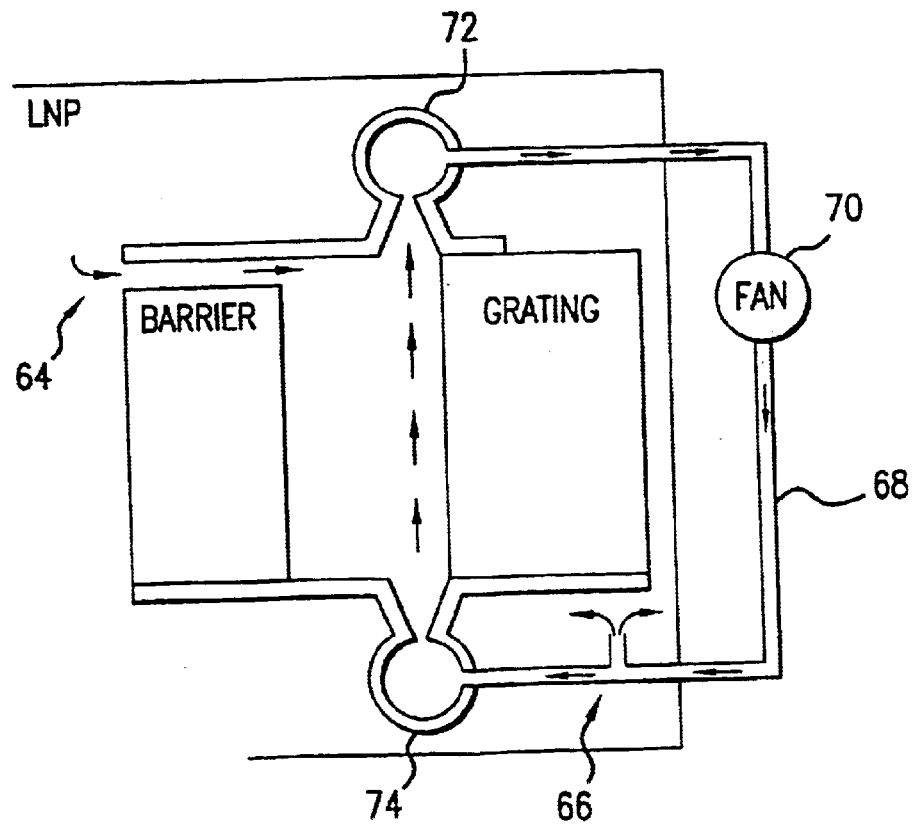

It is known to purge line narrowing packages; however, the prior art teaches keeping the purge flow from flowing directly on the grating face so that purge flow is typically provided through a port located at positions such as behind the face of the grating. Applicants have discovered, however, that at very high repetition rates a layer of hot gas (nitrogen) develops on the face of the grating distorting the wavefront of the beam and causing unwanted variations in the wavelength and bandwidth of the output laser beam. This distortion can be corrected at least in part by the active wavelength control discussed above. Another approach is to purge the face of the grating as shown in FIG. 9. In FIG. 9, small holes (1 mm on ¼ inch spacings) in the top of 10-inch long ⅜ inch diameter purge tube 61 provides the purge flow. The purge gas can be nitrogen from a pure nitrogen supply as described in a following section. Other techniques are shown in FIGS. 9A, 9B and 9C. In FIG. 9A, the $N_2$ enters through a slit in the $N_2$ tube. In FIG. 9B, the purge flow is straight up from the face of the grating and in the FIG. 9C example the purge gas is recirculated.

Ultra Pure Nitrogen Purge System

A preferred embodiment of the present invention includes an ultra-pure $N_2$ purge system which provides greatly improved performance and substantially increases component lifetime.

Figures 10, 10A:
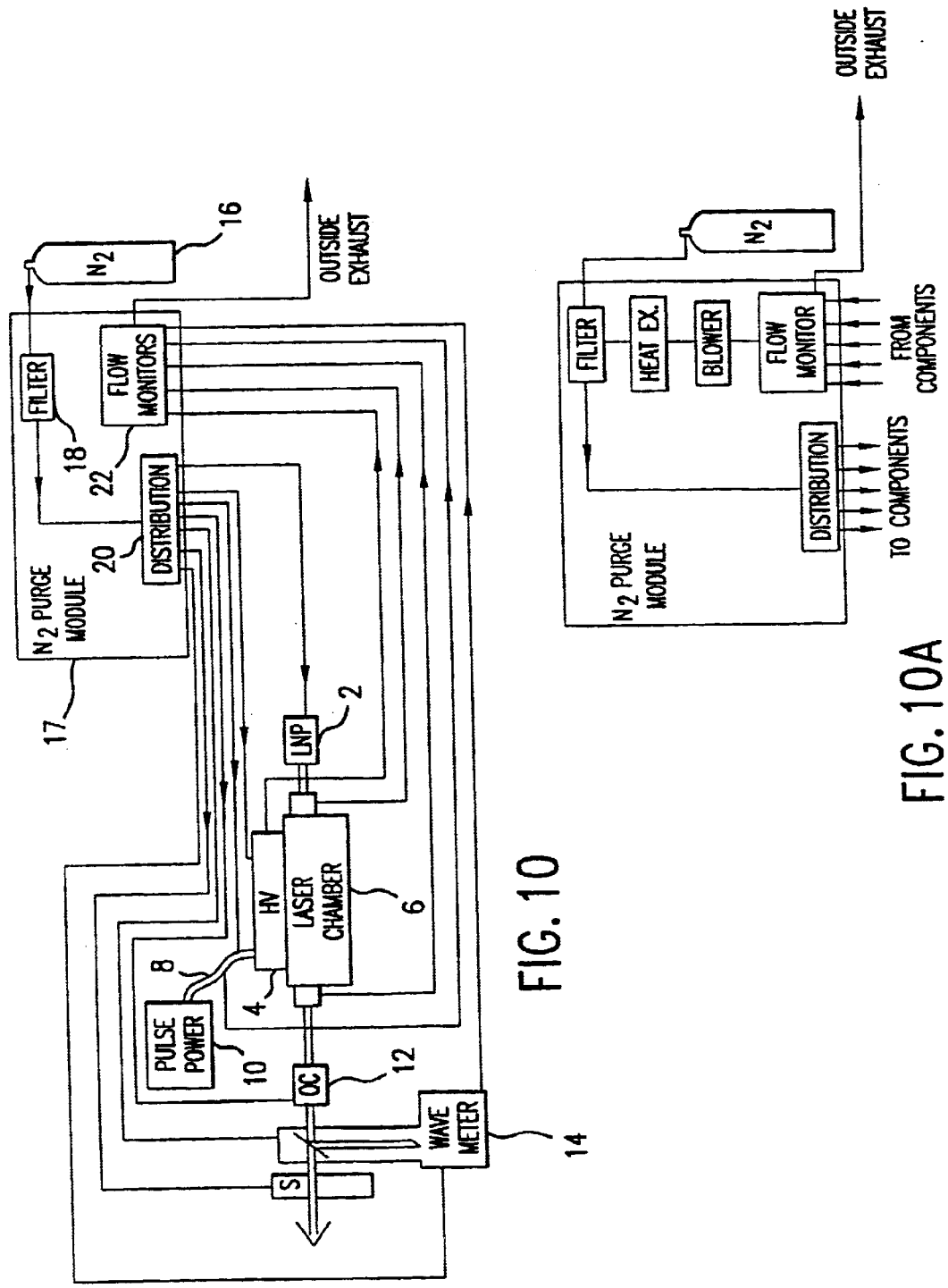
FIGS. 10 and 10A show details of a purge system.

FIG. 10 is a block diagram showing important features of a first preferred embodiment the present invention. Five excimer laser components which are purged by nitrogen gas in this embodiment of the present system are LNP 2, high voltage components 4 mounted on laser chamber 6, high voltage cable 8 connecting the high voltage components 4 with upstream pulse power components 10, output coupler 12 and wavemeter 14. Each of the components 2, 4, 8, 12, and 14 are contained in sealed containers or chambers each having only two ports an $N_2$ inlet port and an $N_2$ outlet port. An $N_2$ source 16 which typically is a large $N_2$ tank (typically maintained at liquid nitrogen temperatures) at a integrated circuit fabrication plant but may be a relatively small bottle of $N_2$. $N_2$ source gas exits $N_2$ source 16, passes into $N_2$ purge module 17 and through $N_2$ filter 18 to distribution panel 20 containing flow control valves for controlling the $N_2$ flow to the purged components. With respect to each component the purge flow is directed back to the module 17 to a flow monitor unit 22 where the flow returning from each of the purge units is monitored and in case the flow monitored is less than a predetermined value an alarm (not shown) is activated.

FIG. 10A is a line diagram showing specific components of this preferred embodiment including some additional $N_2$ features not specifically related to the purge features of the present invention.

$N_2$ Filter

An important feature of the present invention is the inclusion of $N_2$ filter 18. In the past, makers of excimer lasers for integrated circuit lithography have believed that a filter for $N_2$ purge gas was not necessary since $N_2$ gas specification for commercially available $N_2$ is almost always good enough so that gas meeting specifications is clean enough. Applicants have discovered, however, that occasionally the source gas may be out of specification or the $N_2$ lines leading to the purge system may contain contamination. Also lines can become contaminated during maintenance or operation procedures. Applicants have determined that the cost of the filter is very good insurance against an even low probability of contamination caused damage.

A preferred $N_2$ filter is Model 500K Inert Gas Purifier available from Aeronex, Inc. with offices in San Diego, Calif. This filter removes $H_2O$, $O_2$, CO, $CO_2$, $H_2$ and non-methane hydrocarbons to sub-parts-per-billion levels. It removes 99.9999999 percent of all particulate 0.003 microns or larger.

Flow Monitors

A flow monitor in unit 22 is provided for each of the six purged components. These are commercially available units having an alarm feature for low flow.

Piping

Preferably all piping is comprised of stainless steel (316SST) with electro polished interior. Certain types of plastic tubing, comprised of PFA 400 or ultra-high purity Teflon, may be used.

Recirculation

A portion or all of the purge gas could be recirculated as shown in FIG. 10A. In this case, a blower 19 and a water cooled heat exchanger 21 is added to the purge module. For example, purge flow from the optical components could be recirculated and purge flow from the electrical components could be exhausted or a portion of the combined flow could be exhausted.

Advantages of the System

The purge system described herein represents a major improvement in long term excimer laser performance especially for ArF and $F_2$ lasers. Contamination problems are basically eliminated which has resulted in substantial increases in component lifetimes and beam quality. In addition, since leakage has been eliminated except through outlet ports the flow can be controlled to desired values which has the effect of reducing $N_2$ requirements by about 50 percent.

Helium Purge of LNP

Another solution to reduce the hot layer effect on the grating is to purge the LNP with helium. Helium has a smaller differential refractive index so that a hot layer will cause less distortion. In addition, helium has much better heat transfer properties than nitrogen. Helium, however, is much more expensive than nitrogen.

The grating equation for the wavelength in the Littrow configuration is:

$$2d\ n \sin \alpha = m\lambda$$

where $\alpha$ is the incidence (diffracted) angle on the grating, m is the diffraction order, n is refractive index of gas, and d is the period of the grating.

The equation has potentially two components which can change with temperature d (the period of the grating) and n (the refractive index of gas). State of the art microlithography excimer lasers usually have an eschelle diffraction grating. The substrate of that grating is usually made out of very low thermally expanding material, such as ULE zero expansion glass made by Corning. The coefficient of thermal expansion (CTE) of this material is very small, typically on the order of $10^{-8}$ 1/C°; therefore, changes in d are very small. On the other hand, refractive index n of gas has a dependence on temperature which is described by the following equation:

$$n = 1 + kT/300$$

where T is the temperature in C°, k is the proportionally coefficient. For nitrogen and for 248 nm light $k=3 \cdot 10^{-4}$. Therefore, for nitrogen we have $\Delta n = 1 \cdot 10^{-6}$ for a $\Delta T = 1C°$. According to the equation (1), this $\Delta n$ will lead to $\Delta\lambda = 0.25$ pm (per ° C.) for 193 nm light. This is a very strong temperature dependence and it means that the temperature of the gas in the LNP should be maintained to better than 0.2 degrees C. if we want the drift to be less than 0.05 pm. This is a very technically difficult task.

For helium, the k coefficient is about $k = 3.8 \cdot 10^{-5}$ or about 8 times smaller than that of nitrogen. Therefore, for helium we have $\Delta n = 1.25 \cdot 10^{-7}$ for a $\Delta T = 1°$ C. According to the equation (1), this $\Delta n$ will lead to $\Delta\lambda = 0.03$ pm (per °C.) for 248 nm light and to approximately 0.025 pm (per °C.) for 193 nm light. Now one has to maintain the temperature inside the LNP to within about 2 degrees, which is much more manageable problem. In fact, the thermal mass of the LNP, which in the preferred embodiment weighs about 5–10 pounds is sufficient to hold the temperature within that range for several minutes. Because helium has so much different properties than nitrogen and the air, the LNP housing is sealed very well and as shown in FIG. 3 the only exit is through the thermally decoupled aperture, the easy bellows unit, the chamber window unit and out a long pigtail tube 95.

Improved Wavemeter Purge

Figure 11:
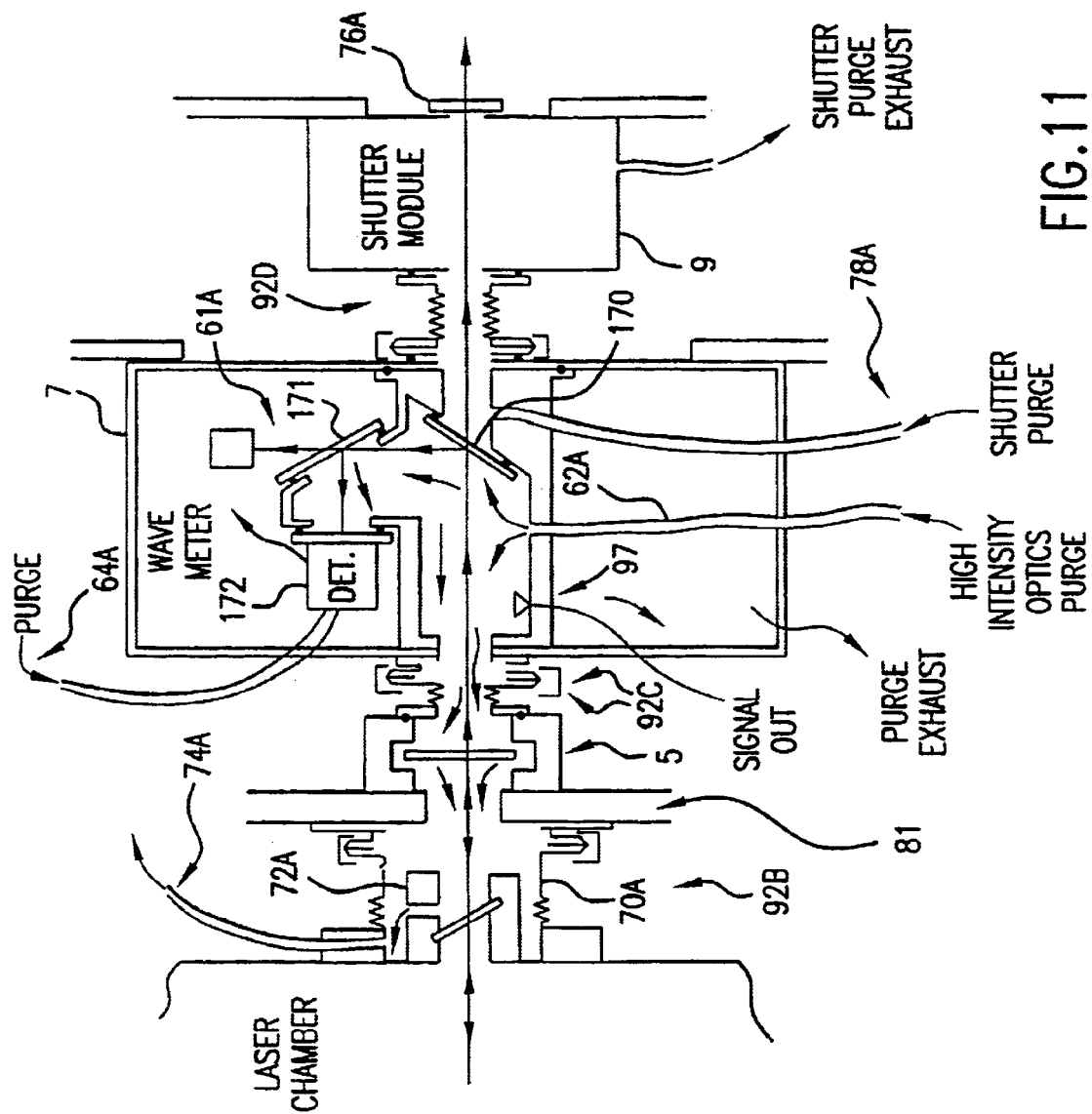
FIG. 11 shows an enlarged view of a portion of FIG. 3.

In this preferred embodiment a special $N_2$ purge technique is used to provide extra purging of the high ultraviolet flux portions of the wavemeter as well as the output coupler and the chamber output window block. This technique is shown in FIG. 11. As explained above the laser output beam intersects partially reflecting mirror 170 which passes 95% of the energy in the beam as an output beam. About 4% of the reflected beam is reflected from mirror 171 to energy detector 172 where the pulse energy is measured. (The other part of the reflected beam passes through mirror 171 as shown at 61A and goes to other monitors in the wave meter.) At 4,000 Hz this 5% of the output energy represents a lot of UV light so special care has been taken to assure that the gas in the path of this portion of the beam is very clean and pure. To do this the wavemeter is modified to seal the region between the upstream side of mirror 170, the upstream side of mirror 171 and the front side of the window of detector 172 from the rest of the wavemeter. And a special purge flow to and from this region is provided as shown at 62A. The remainder of the wavemeter is purged by a second purge flow shown at 64A which first purges energy detector 172. The exhaust from energy detector 172 is into the wavemeter to purge the remainder of the wavemeter optics which are subject to much less intense ultraviolet flux than the high intensity portion.

The purge flow 62A is confined in the wavemeter by seals at mirrors 170, 171 and the 172 detector window. The purge flow exits this region along the laser output beam path through a bellows region 92C back to the output coupler module 5 to purge it. The flow then flows through bellows unit 92B and into window block 72A, out through an exit port in the window block and an exit port in bellows unit 10 92B then back through a tube to $N_2$ purge module 17 as shown at 74A.

Shutter Purge

The downstream side of window 170 is purged with purge flow from shutter module 5K. The purge flow may be from module 17 as shown in FIG. 19 or in some cases window 76A is removed and the output of shutter module is openly connected with a purged customer beam line in which case the exit purge line at 78A may be directed to a customer purge return system or exhausted to atmosphere.

Purge Contamination Detection

A preferred embodiment of the present invention includes a special purge contamination detection system. This detection system comprises a small microphone such as an electret electronic microphone available from suppliers such as Audio Products with offices in Dayton, Ohio. The output of electret microphone is fed to a high impedance preamplifier. This microphone detects acoustic waves created by any significant absorption of the laser beam passing through this confined chamber. Normally there will be no significant contamination in the purge flow and therefore no significant acoustic waves will be generated. However, any extremely minute quantity of any material (gas or otherwise) that absorbs any significant fraction of the laser pulse at 193 nm will produce an easily detected shock wave when illuminated by the short pulse (about 30 ns) of the laser.

A useful electret microphone is Audio Products Part No. POM-2244P which is 2.2 mm high and 6.0 mm diameter. It has a sensitivity of −44+/−3 dB(0 dB=1 V/Pa). The detector can be time gated to sample acoustic forces just prior to and during laser pulses in order to improve signal to noise ratios. The unit can be calibrated by allowing some extremely small known quantities of a known absorber such as oxygen to be introduced in with the purge gas. This is very simple and inexpensive but very effective detector of purge gas contamination. It will not tell the laser operator exactly what the contamination is but it will tell him that he has a problem with the flow such as a stoppage of flow which would permit oxygen to diffuse into the beam path.

Various modifications may be made to the present invention without altering its scope. Those skilled in the art will recognize many other possible variations. For example, other aperture designs for dissipating the heat associated with the apertured portion of the beam could be used instead of the specific ones shown in FIGS. 6A–C and FIG. 7. The heat sink portion could be made of copper for better heat transfer and greater thermal capacity (but at an increased cost). Also a very low thermal expansion material could be used, such as Invar®. Another approach would be to use an aperture with walls at a sharp angle to the beam to reflect away a very large portion of the apertured portion of the beam. Another approach is to use a diffractive type aperture. In this case, the walls of the aperture are transparent to the beam but are angled to diffract apertured portions of the beam out of the beam path. The heat sink decoupled from the LNP (such as the one shown) could be used to absorb the diffracted portions of the beam and to dissipate the resulting heat. In some embodiments, narrower bandwidths are provided with a four prism beam expander and a larger grating in the LNP shown in FIG. 4A. Other output couplers with reflectivities greater or smaller than the above specified 20% can be used. For example, in some ArF embodiments, Applicants prefer a 30% reflectivity and in some KrF designs a 10% reflectivity. Accordingly, the above disclosure is not intended to be limiting and the scope of the invention should be determined by the appended claims and their legal equivalents.

We claim:

1. An extreme repetition rate gas discharge modular laser capable of operating at pulse repetition rates in excess of 2,000 pulses per second, said laser comprising:
    A) a laser chamber module containing:
        (1) a laser gas,
        (2) two elongated electrodes, defining a discharge region
        (3) a tangential type fan for producing sufficient gas velocities of said laser gas in said discharge region to clear from said discharge region, following each pulse, substantially all discharge produced ions prior to a next pulse when operating at a repetition rate in the range of 4,000 pulses per second or greater, and
        (4) a heat exchanger system comprising at least one finned heat exchangers, said system being capable of removing at least 16 kw of heat energy from said laser gas,
    B) a pulse power system configured to provide electrical pulses to said electrodes sufficient to produce laser pulses from said discharge region at rates of about 4,000 pulses per second with precisely controlled pulse energies in the range of about 5 mJ,
    C) a first optics module comprising line narrowing optical components,
    D) a second optics module comprising an output coupler, said output coupler and said line narrowing module defining a resonant cavity and a laser beam path through discharge region and said laser chamber module and being mounted in said laser separated from said chamber module and
    E) a beam path purge system for purging portions of said laser beam path, said beam path purge system comprising:
        1) a first easy sealing bellows seal unit for providing with said purge system a vacuum quality substantially oxygen free beam path between said chamber module and said first optic module and,
        2) a second easy sealing bellows seal unit for providing with said purge system a vacuum quality substantially oxygen free beam path between said chamber module and said second optic module;
    wherein said first and second easy sealing bellows seals units each can be quickly and easily removed for fast replacement of said chamber module.

2. A modular laser as in claim 1 wherein each of said first and second easy sealing bellows seals units comprise a hand-operated lever for removing said seals by hand without any special tools.

3. A modular laser as in claim 1 and further comprising a thermally decoupled aperture positioned in said beam path between said chamber module and said first optical module.

4. A modular laser as in claim 3 wherein said thermally decoupled aperture is a part of said first easy sealing bellows seal unit.

5. A modular laser as in claim 1 wherein said laser is configured to produce a pulsed laser beam defining an output beam and also comprises a wavemeter module for monitoring wavelength and bandwidth of said output beam.

6. A modular laser as in claim 5 and further comprising a third easy sealing bellows seal for providing with said purge system a vacuum quality substantially oxygen free beam path between said output coupler and said wavemeter module.

7. A modular laser as in claim 1 wherein said beam path purge system comprises a nitrogen purge source.

8. A modular laser as in claim 1 wherein said beam path purge system comprises a helium purge source and said purge system is configured to purge said line narrowing module with helium.

9. A modular laser as in claim 1 wherein said purge system includes a nitrogen purge source and a helium purge source and said helium purge source is configured to purge at least said line narrowing module with helium.

10. A modular laser as in claim 1 and further comprising a purge gas contamination detector for detecting laser beam absorbing material in said beam path or in said output beam.

11. A modular laser as in claim 10 wherein said contamination detector comprises a electret acoustic detector for detecting pressure waves resulting from the absorption by said material of laser pulse radiation.

12. A laser as in claim 1 further comprising:
a laser beam measurement and control system comprising an etalon unit, a photo diode array, a programmable logic device, and optics to focus laser light from said etalon unit on to said photo diode array wherein said programmable logic device is programmed to analyze data from said photodiode array to determine locations on said photo diode array of etalon fringes.

13. A laser as in claim 12 wherein said measurement and control system also comprises a microprocessor programmed to calculate wavelength and bandwidth from fringe data located by said programmable logic device.

14. A laser as in claim 12 wherein said programmable logic device is programmed with an algorithm for calculating wavelength and bandwidth based on measurement of said fringes.

15. A laser as in claim 14 wherein said programmable logic device is configured to make calculations of wavelength and bandwidth faster than $1/4,000$ of a second.

16. A laser as in claim 15 wherein said etalon unit comprises a diffractive diffusing element.

17. A laser as in claim 12 wherein said measurement and control system comprises a primary beam splitter for splitting off a small percentage of the light from the output pulses from said laser, a second beam splitter for directing a portion of said small percentage to said pulse energy detector and a means isolating a volume bounded by said primary beam splitter, said secondary beam splitter and a window of said pulse energy detector from other portions of said measurement and control system to define an isolated region.

18. A laser as in claim 17 and further comprising a purge means for purging said isolated region with a purge gas.

19. A laser as in claim 18 wherein said laser further comprises an output coupler unit, and an output window unit said purge means being configured so that exhaust from said isolated region also purges said output coupler unit and said output window unit.

20. A laser as in claim 1 wherein said line narrowing unit comprises a grating defining a grating face and a purge means for forcing purge gas adjacent to said grating face.

21. A laser as in claim 1 and farther comprising a nitrogen purge system comprising a nitrogen purge system comprising a nitrogen filter.

22. A laser as in claim 1 and farther comprising a nitrogen comprising a purge system comprising flow monitors, said laser also comprising purge exhaust tubes for transporting exhaust purge gas from said laser.

23. A laser as in claim 1 and further comprising a shutter unit comprising an electrically operated shutter and a power meter which can be positioned in a laser output beam path with a command signal.

24. A laser as in claim 1 wherein each of said first and second easy seal bellows seals units comprise a metal C-seal ring.

25. A laser as in claim 1 wherein each of said first and second easy sealing bellows seals units contains no elastomer, provides vibration isolation from said chamber, provides beam train isolation from atmospheric gases and permits unrestricted replacement of said laser chamber without disturbance of said LNP or said output coupler unit.

26. A laser as in claim 25 wherein at least one of said easy sealing bellows seals comprise a bellows part having a circular ridge configured to prevent damage to said metal c-seal ring.

* * * * *

UNITED STATES PATENT AND TRADEMARK OFFICE
CERTIFICATE OF CORRECTION

PATENT NO.       : 6,795,474 B2
APPLICATION NO.  : 10/000991
DATED            : September 21, 2004
INVENTOR(S)      : Partlo et al.

It is certified that error appears in the above-identified patent and that said Letters Patent is hereby corrected as shown below:

On the Title page of the patent under "(75) Inventors":
"Holzer K. Glatzel" should be changed to --Holger K. Glatzel--.

Column 12:
Line 35, "module" should be changed to --components--;
Line 37, after "through" insert --the--;
Line 50, "optic" should be changed to --optics--;
Line 60, "optical" should be changed to --optics--.

Column 13:
Line 11, "module" should be changed to --components--:
Line 15, "module" should be changed to --components--;
Line 27, "on to" should be changed to --onto--.

Column 14:
Line 2, "second" should be changed to --secondary--;
Line 10, (claim 19), delete "further";
Line 11, delete "comprises an", after "output cooler" insert --comprises-- and delete "unit, and";
Line 12, before "said purge means" insert --with--;
Line 13, after "output coupler" delete "unit";
Line 16, (claim 20), after "line narrowing" delete "unit" and insert --components--
Line 17, "comprises" should be changed to --comprise--;
Line 19, (claim 21), "farther" should be changed to --further--;
Line 22, (claim 22), "farther" should be changed to --further--;
Line 24, (claim 24), "seal" should be changed to --sealing--;

UNITED STATES PATENT AND TRADEMARK OFFICE
CERTIFICATE OF CORRECTION

PATENT NO. : 6,795,474 B2
APPLICATION NO. : 10/000991
DATED : September 21, 2004
INVENTOR(S) : Partlo et al.

It is certified that error appears in the above-identified patent and that said Letters Patent is hereby corrected as shown below:

Column 14: (cont'd)
Line 39, (claim 25), after "output coupler" delete "unit".

Signed and Sealed this

Third Day of April, 2007

JON W. DUDAS
*Director of the United States Patent and Trademark Office*